(12) United States Patent
Tekleab et al.

(10) Patent No.: US 8,866,266 B2
(45) Date of Patent: Oct. 21, 2014

(54) SILICON NANOTUBE MOSFET

(71) Applicant: International Business Machines Corporation, Armonk, NY (US)

(72) Inventors: Daniel Tekleab, Wappingers Falls, NY (US); Hung H. Tran, Hopewell Junction, NY (US); Jeffrey W. Sleight, Ridgefield, CT (US); Dureseti Chidambarrao, Weston, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/073,017

(22) Filed: Nov. 6, 2013

(65) Prior Publication Data

US 2014/0061583 A1 Mar. 6, 2014

Related U.S. Application Data

(62) Division of application No. 13/036,292, filed on Feb. 28, 2011.

(51) Int. Cl.
| | |
|---|---|
| H01L 29/06 | (2006.01) |
| H01L 29/78 | (2006.01) |
| B82Y 10/00 | (2011.01) |
| H01L 29/775 | (2006.01) |
| H01L 29/66 | (2006.01) |

(52) U.S. Cl.
CPC .............. *H01L 29/78* (2013.01); *B82Y 10/00* (2013.01); *H01L 29/775* (2013.01); *H01L 29/66666* (2013.01); *H01L 29/66439* (2013.01); *H01L 29/0676* (2013.01); *H01L 29/7827* (2013.01)
USPC ............ 257/618; 257/401; 257/621; 257/623

(58) Field of Classification Search
USPC .......................... 257/288, 401, 618, 621, 623
See application file for complete search history.

(56) References Cited

U.S. PATENT DOCUMENTS

| | | | | |
|---|---|---|---|---|
| 5,561,308 | A * | 10/1996 | Kamata et al. | 257/301 |
| 2005/0184348 | A1* | 8/2005 | Youn et al. | 257/401 |
| 2009/0212341 | A1 | 8/2009 | Cheng et al. | |
| 2011/0233512 | A1* | 9/2011 | Yang et al. | 257/9 |
| 2013/0140628 | A1* | 6/2013 | Higashino | 257/329 |
| 2013/0237024 | A1* | 9/2013 | Alsmeier et al. | 438/264 |

OTHER PUBLICATIONS

Takato, et al., "High Performance CMOS Surrounding Gate Transistor (SGT) for Ultra High Density LSI's", IEDM 1988 pp. 222-225.
Nitayama, et al., "Multi-Pillar Surrounding Gate Transistor (M-SGT) for Compact and High Speed Circuits", IEEE TED, vol. 38, No. 3., pp. 579-583, 1991.

(Continued)

*Primary Examiner* — Matthew E Warren
(74) *Attorney, Agent, or Firm* — Ira D. Blecker; H. Daniel Schnurmann

(57) ABSTRACT

A nanotubular MOSFET device extends a scaling roadmap while maintaining good short channel effects and providing competitive drive current. The nanotubular MOSFET device includes a concentric tubular inner and outer gate separated from each other by a tubular shaped epitaxially grown silicon layer, and a source and drain respectively separated by spacers surrounding the tubular inner and outer gates.

22 Claims, 6 Drawing Sheets

(56) References Cited

OTHER PUBLICATIONS

Sakui, et al., "A Compact Space and Efficient Drain Current Design for Multipillar Vertical MOSFETs", IEEE TED vol. 57, No. 5, pp. 1768-1773, 2010.

Yang, et al., "Vertical Silicon-Nanowire-Nanowire Formation and Gate-All-Around MOSFET", IEEE EDL vol. 29, No. 7, 2008.

Sun, et al., "Multibit Programmable Flash Memory Realized on Vertical Si Nanowire Channel", IEEE EDL, vol. 31, No. 5, 2010.

Masahara, et al., "Ultrathin Channel Vertical DG MOSFET Fabricated by Using Ion-Bombardment-Retarded Etching"., IEEE TED, vol. 51, No. 12, pp. 2078-2085, 2004.

Prosecution History of Related U.S. Appl. No. 13/036,292, Office Action mailed Dec. 19, 2013, all pages.

Prosecution History of Related U.S. Appl. No. 13/036,292, Amendment to Office Action mailed Dec. 19, 2013, Amendment submitted Mar. 13, 2014, all pages.

\* cited by examiner

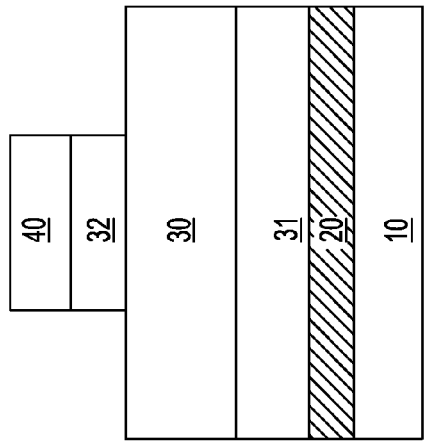
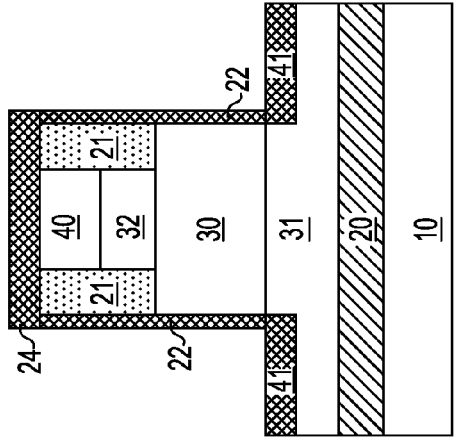
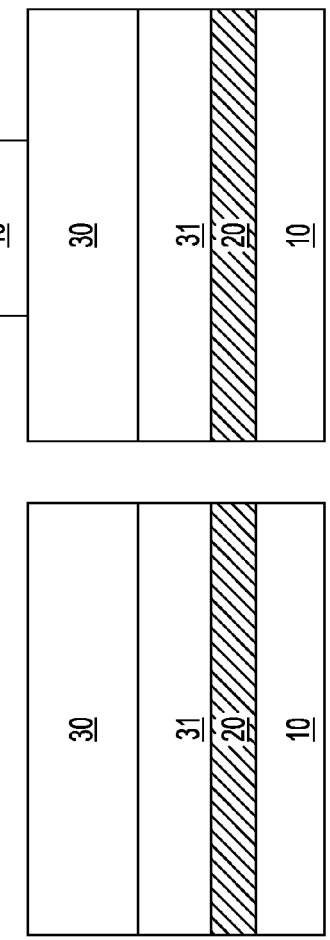
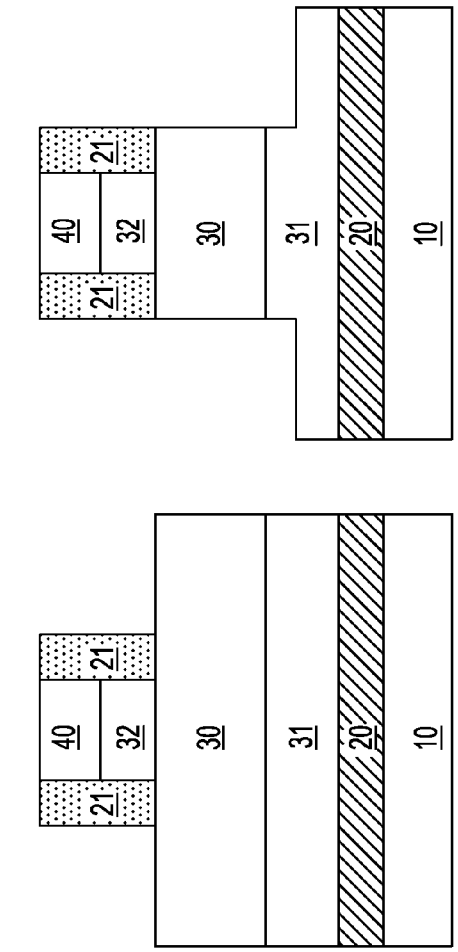

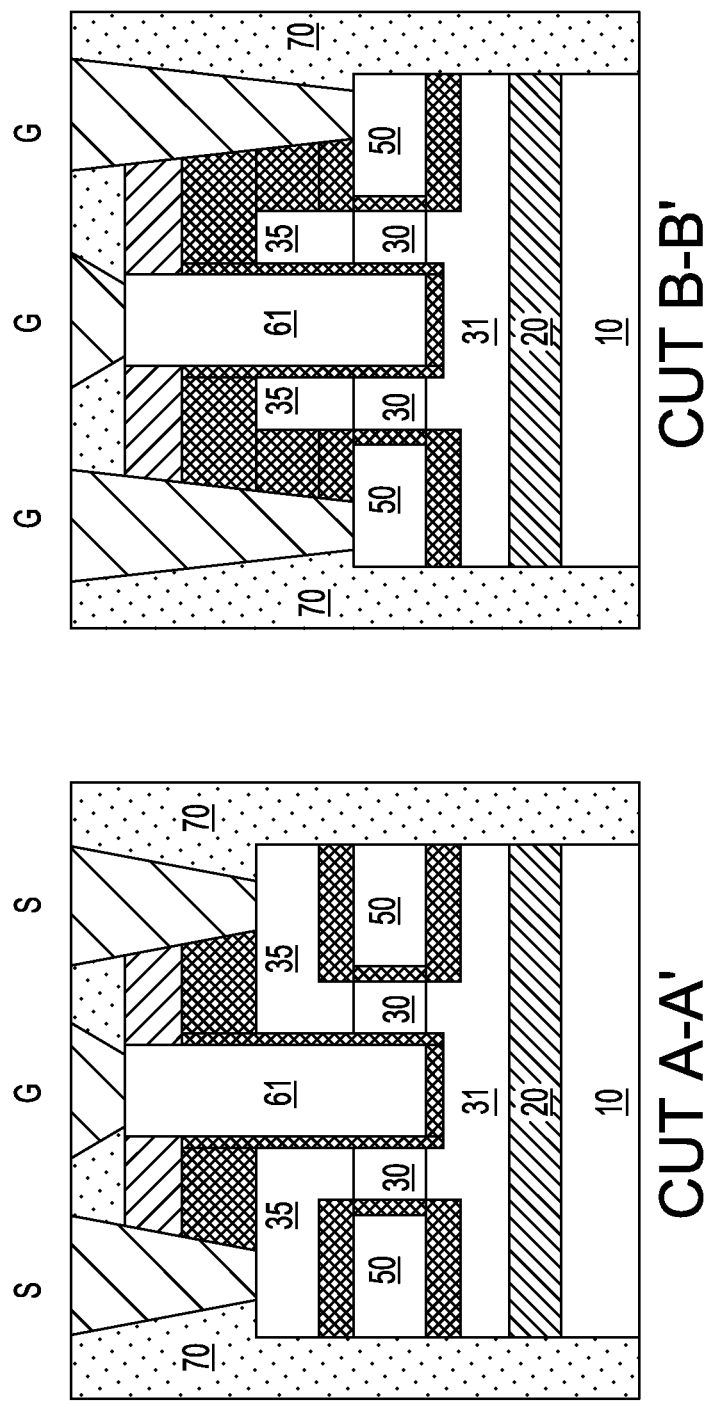

SILICON NANOTUBE MOSFET

This application is a divisional of U.S. patent application Ser. No. 13/036,292 filed on Feb. 28, 2011, now pending.

FIELD OF THE INVENTION

The present invention relates to metal-oxide-semiconductor tubular field effect transistor (MOSFET) structures, and more particularly to a Si nanotube MOSFET device.

BACKGROUND

Continuous scaling of silicon-based metal oxide semiconductor field effect transistors (MOSFETs) has contributed to relentless advances in semiconductor technology. As the device scale approaches nanometer ranges, further scaling of semiconductor devices faces various challenges. Some challenges arise from the quantum mechanical nature of material properties at atomic dimensions such as gate tunneling current. Some other challenges arise from the stochastic nature of material properties such as fluctuations in dopant concentration on a microscopic scale, and resulting spread in threshold voltage and leakage current at semiconductor junctions. These and other challenges in semiconductor technology have renewed interest in semiconductor devices having non-conventional geometry.

A technology solution developed to enhance performance of complementary-metal-oxide-semiconductor (CMOS) devices and used extensively in advanced semiconductor devices is semiconductor on insulator (SOI) technology. While an SOI MOSFET typically offers advantages over a MOSFET with comparable dimensions and built on a bulk substrate by providing higher on current and lower parasitic capacitance between the body and other MOSFET components, the SOI MOSFET tends to have less consistency in the device operation due to "history effect" or "floating body effect", in which the potential of the body, and subsequently the timing of the turn-on and the on-current of the SOI MOSFET are dependant on the past history of the SOI-MOSFET. Furthermore, the level of leakage current also depends on the voltage of the floating body which poses a challenge in the design of low power SOI MOSFET.

The body of an SOI MOSFET stores charge which is dependent on the history of the device, hence becoming a "floating" body. As such, SOI MOSFETs exhibit threshold voltages which are difficult to anticipate and control, and which vary in time. The body charge storage effects result in dynamic sub-threshold voltage (sub-Vt) leakage and threshold voltage (Vt) mismatch among geometrically identical adjacent devices.

The floating body effects in SOI MOSFETs are particularly a concern in applications such as static random access memory (SRAM) cells, in which threshold voltage (Vt) matching is extremely important as operating voltages continue to scale down. The floating body also poses leakage problems for pass-gate devices. Another exemplary semiconductor device in which the floating body effects are a concern is attacked SOI MOSFET structures, as used in logic gates, in which the conductive state of SOI MOSFET devices higher up in the stack are strongly influenced by stored body charge, resulting in reduced gate-to-source voltage overdrive available to these devices. Yet other exemplary semiconductor devices in which control of floating body is critical are sense amplifiers for SRAM circuits and current drives in a current minor circuit.

Another problem associated to SOI MOSFETs relate to self heating caused by high current flow due to the $I^2R$ law. Since the BOX has lower heat conductivity, the heat in the SOI continues to build causing a carrier to carrier scattering, which in turn leads drive current degradation.

In view of the above, a need exists for semiconductor devices capable of minimizing the floating body effect, the self heating effect in order to provide a consistent performance. Furthermore, there exists a need for a semiconductor structure that advantageously employs the floating body effect to perform a useful function and new methods of manufacturing the same. Additionally, there exists a need in industry for a semiconductor device capable of improving performance, by increasing, for example, the on current per unit device area over existing semiconductor devices.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which:

FIG. 1 shows a cross-section of a side view of an initial manufacturing process step of the nanotubular FET device, showing an SOI substrate;

FIG. 2 is a cross-section of a side view of a covering hard mask layer deposited on the top surface of the SOI substrate;

FIG. 3 depicts a portion of the top layer vertically etched down, leaving a mesa structure having the shape of a structure predetermined by the two-dimensional shape of the above covering layer;

FIG. 4 shows a sacrificial silicon oxide layer created by depositing the oxide and etching back;

FIG. 5 illustrates forming the outer side of the tube;

FIG. 6 shows an outer gate oxide dielectric formed on the surface of the semiconductor structure and on the top of the covering mesa;

FIGS. 18 and 19 show side views of the final Si Nanotube device where contacts have been formed including a dielectric layer filling the spaces between the contacts, wherein FIG. 18 shows a side view along a cut labeled A-A', and FIG. 19, along a cut labeled B-B' (see FIG. 20);

SUMMARY

Figure 7:
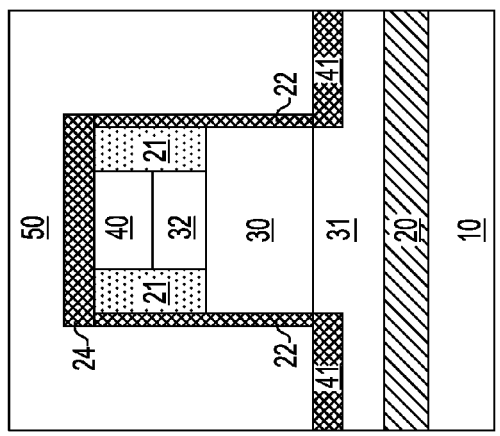
FIG. 7 depicts forming an outer-gate electrode on the dielectric layers.

In one aspect of an embodiment of the present invention, a metal-semiconductor field effect transistor (MOSFET) is provided in a tubular configuration having an inner and an outer gate. In one embodiment, a vertical tubular silicon-on-silicon is provided having a layer of highly doped material. The highly doped region is advantageously used as the extension region of a tubular transistor. A hard mask is deposited to define the inner region of the tube. Using sequences of reactive ion-etching (RIE) and selective etching the outer gate stack consisting of gate dielectric (conventional $SiO_2$ or Hi-K) and gate material (polysilicon or metal gate) is formed. The thickness of the tube is determined by removing the hard mask initially used to define the inner region and using RIE the inner region of the tube is formed. It is followed by ion implantation to form the source or the drain extension. In the inner tube, dielectric and gate material are deposited to form an inner gate stack. By using self-alignment Si is epitaxially grown to form the source region. Finally, using self alignment and deep trench etching, the inner gate, outer gate, source and drain are silicided and contacts are formed.

In another aspect of an embodiment, the inner gate electrode and the outer gate electrode can operate with the same voltage polarity relative to the body of the tubular semiconductor structure to induce inversion layers on both sides of the tube and to reduce the floating body effect and to enable a tighter channel control. Alternatively, the inner gate electrode and the outer gate electrode may operate with an opposite polarity relative to the source of the tubular semiconductor structure to induce an inversion layer on one side and accumulation layer on the other side of the tubular semiconductor structure so that the floating body effect is amplified and the nanotube transistor may store electrical charges as a memory device.

In a further aspect, an embodiment of the present invention provides a nanotubular MOSFET device including: a tubular inner gate surrounded by a tubular Si layer; a tubular outer gate surrounding the Si layer; and a source and drain respectively separated by spacers surrounding the tubular inner and outer gates.

In still another aspect, an embodiment provides a nano MOSFET device includes an inner and an outer gate separated by a silicon layer, the inner-silicon-outer combination having a Taurus shape.

In a further aspect, an embodiment provides a nanotubular MOSFET device on a substrate including: a substrate a cylindrical shaped Si layer; fn outer gate surrounding the cylindrical Si layer and positioned between a bottom spacer and a top spacer; a silicon epitaxial layer on the top spacer adjacent to a portion of the cylindrical shaped Si layer; an inner portion of the cylindrical shaped Si providing a hollow cylinder; an inner spacer at the bottom of the inner cylinder; an inner gate having a portion of the hollow cylinder filled; a sidewall spacer adjacent to the inner gate; and a deep trench accessing and contacting the outer gate and drain.

DETAILED DESCRIPTION

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

Referring to FIG. 1, a side view is illustrated showing in one embodiment, a semiconductor on insulator (SOI) portion is defined, patterned and etched to form the SOI substrate of the present MOSFET device. The SOI substrate preferably includes a handle substrate 10, an insulator layer 20, a 'buried' semiconductor layer 31 and a 'body' semiconductor layer 30. The handle substrate 10 may be formed using semiconductor material, metallic material or insulating material. The insulator layer 20 is preferably made of material such as a dielectric oxide and/or a dielectric nitride. The buried layer 31 is a highly doped (i.e., conductive), monocrystalline semiconductor material that functions as a conductive electrical layer. Layer preferably a monocrystalline silicon layer having epitaxial alignment. Layers 30 and 31 are of crystallography-compatible materials, e.g., silicon and silicon-germanium, Si and SiGe or III-V compatible ones such as GaAs—InGaAs. Different crystallographic orientations are contemplated. Layer 31 can be salicided following known processes.

The SOI layer that provides the SOI portion may include any semiconducting material including, but not limited to, Si, strained Si, SiC, SiGe, SiGeC, Si alloys, Ge, Ge alloys, GaAs, InAs, and InP, or any combination thereof. The SOI layer may be thinned to a desired thickness by planarization, grinding, wet etch, dry etch or any combination thereof. Thinning the SOI layer can be achieved by oxidizing the semiconductor material, such as silicon, by a thermal dry or wet oxidation process, and then wet etch the oxide layer using a hydrofluoric acid mixture. This process can be repeated to achieve the desired thickness.

In one embodiment, the SOI layer has a thickness ranging from 1.0 nm to 20.0 nm. In another embodiment, the SOI layer has a thickness ranging from 2.0 nm to 10.0 nm. In a further embodiment, the SOI layer has a thickness ranging from 3.0 nm to 5.0 nm. It is noted that the above thickness for the SOI layer is provided for illustrative purposes only, as other thicknesses for the SOI layer have been contemplated, and may be employed in the present structure.

The second semiconductor layer 20 may be a semiconducting material including, but not limited to: Si, strained Si, SiC, SiGe, SiGeC, Si alloys, Ge, Ge alloys, GaAs, InAs, InP as well as other IIII/V and II/VI compound semiconductors.

The dielectric layer 30 that may be present underlying the SOI layer and atop the second semiconductor layer may be formed by implanting a high-energy dopant into the SOI substrate and then annealing the structure to form a highly doped region. Dopant is introduced to the semiconductor material by ion implantation or gas phase doping through semiconductor layer 31 using the thermal anneal, as described above. In another embodiment, the dielectric layer 31 may be deposited or grown on top of the semiconductor layer 30. In yet another embodiment, the SOI substrate 10 may be formed using wafer-bonding techniques, where a bonded wafer pair is formed utilizing glue, adhesive polymer, or direct bonding.

The SOI portion can be formed from the SOI layer using deposition, photolithography and selective etch processes. Specifically, a pattern is produced by applying a photoresist to the surface to be etched, exposing the photoresist to a pattern of radiation, and then developing the pattern into the photoresist utilizing a resist developer. The pattern has the geometry of the desired final structure of the selective etching process. Once the patterning of the photoresist is completed, the sections covered by the photoresist are protected while the exposed regions are removed using a selective etching process that removes the unprotected regions. The photoresist pattern is then transferred into the hard mask material using an etch process, such as a selective etch process, forming the SOI portion.

Referring to FIG. 2, a covering layer 40 is formed on top of layer 30. The covering material can be nitride, silicon nitride, silicon oxynitride and the like. Layer 40 is lithographically patterned and chemically processed into a portion 40 having a two-dimensional shape of a circle and a vertical sidewall. Other two dimensional shapes such as elliptical, square, rectangular and multi-faceted are possible. It is assumed that layer 40 preferably takes a circular shape, also referenced to as a circular/tubular dot. The thickness of layer 40 is preferably about 50 nm. Layer 40 functions both as a protectively layer and the anchored one from which the device will be defined and aligned upon in a self-aligned fabrication process.

Referring to FIG. 3, following the formation of layer 40, a portion of layer 30 is vertically etched down forming a mesa structure that includes layers 30, 32 and 40, whereas layers 30 and 32 are made of the same material, preferably monocrystalline silicon. The shape of the structure is predefined by the two-dimensional shape of 40. Methods to perform vertical etch includes RIE, combined wet-etch and dry-etch, as well as other anisotropic etching processes. Additional processing steps, e.g., hydrogen annealing can be performed to reconcile the vertical semiconductor wall and to reduce its roughness.

Referring to FIG. 4, a circular, sacrificial sidewall 21 is built around and covering the nitride dot layers 40 and layer 32, preferably made of monocrystalline silicon abutting at layer 30. Layer 21 is formed using a dielectric material, such as oxide or nitride. Methods to build a high-quality sidewall are well-known in the art, e.g., using a combination of oxide deposition, planarization, and etch back process using a combination of wet and dry (RIE) etch. The thickness of layer 21 is preferably of the order of about 5 to 10 nm.

Referring to FIG. 5, after forming structure 21, the outer side of the tube is formed by etching along the sides of layer 30 and by partially etching away the parts of layer 31 not covered by layer 21 in a process similar to that described in FIG. 3. The depth, of which layer 31 is etched in, is a critical parameter for optimizing the device performance. It is critical to perform reconciliation processes such as hydrogen annealing to ensure a smooth and even vertical wall. It is worth noting that the semi-conductor layer 31 is a region of high dopant concentration compared to the semiconductor layer 30.

Referring to FIG. 6, an outer gate oxide dielectric 22, 24 and 41 is formed on the surface of the semiconductor structure 30 and 31, and on the top of layers 21 and 40. The gate dielectric abuts at the vertical wall of structure 30 and 31. A gate-to-drain-isolation layer 41 is formed on the horizontal surface of structure 31. Layer 22 and 41 can be of the same dielectric material. The thickness of layer 22 is about 1 to 10 nm, preferably from 1.0 to 3 nm. The thickness of layer 41 is approximately 1 nm to 30 nm, preferably 3 nm to 10 nm. Layers 22 and 41 can be formed simultaneously using thermal oxidation and/or thermal nitridation process Likewise, layer 24 is preferably also deposited concurrently with layers 22 and 41. In addition, the thickness of 41 can be increased using one of the anisotropic deposition techniques known in the field such as, CVD, high-density, plasma-assisted deposition (HPD), atomic layer deposition (ALD), liquid source misted chemical deposition (LSMCD), and the like.

Referring to FIG. 7, an outer-gate electrode 50 is formed by way of dielectric layers 21, 22, 41 and 24. The material used includes a semiconductor material or a conductive alloy. The preferred material used is polysilicon although other conductive materials are contemplated. The formation of the aforementioned layers includes known techniques, such as LPCVD, ALD and the like. The material fully covers the structure so that a planarization process can be safely applied in the next step.

Figure 8:
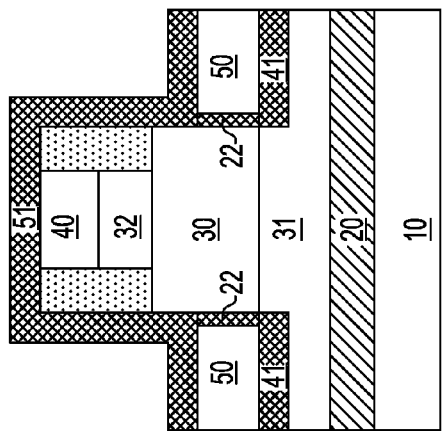
FIG. 8 shows the outer gate oxide dielectric layer partially removed, followed by a dielectric layer deposited to form a spacer.

Referring to FIG. 8, the layer 50 is partially removed, first through a planarization process, and second using a dry-etch process, such as RIE. Additional annealing can be performed to control the thickness of the remaining layer 50 which functions as the outer gate of the device. A dielectric material (layer 51) such as nitride, silicon oxynitride or silicon oxide is then deposited. Layer 51 is intended to act as a spacer.

Figure 9:
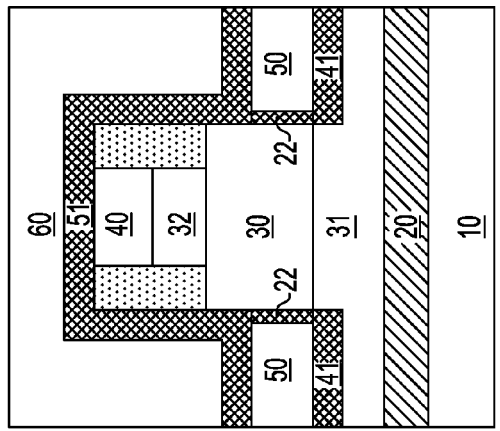
FIG. 9 depicts a sacrificial layer surrounding the above dielectric layer, followed planarization.

Referring now to FIG. 9, a layer 60 of sacrificial material is deposited surrounding covering layer 51, followed by planarization, using as the preferred material a polysilicon-germanium alloy having a different etching rate compared to layer 51 to selectively etch layer 51.

Figure 10:
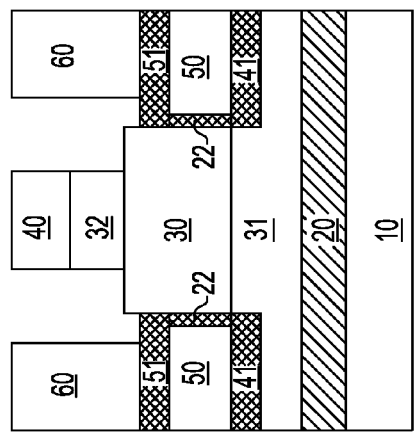
FIG. 10 illustrates partially removing the above dielectric exposing the covering.

Referring to FIG. 10, layer 51 is partially removed, preferably, first by way of a chemical-mechanical polish (CMP) process that exposes the layer 40. Next, the oxide material 51 is etched using, e.g., wet etch or RIE, partially exposing silicon layers 30 and 32. Then, ion implantation is performed on the exposed layers 30 and 32. The purpose of the implantation is to form the source extension region and form a good overlapped of the extension and the gate.

Figure 11:
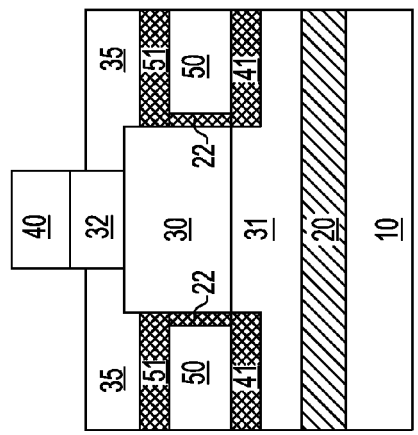
FIG. 11 illustrates removing the remaining sacrificial layer followed by growing a monosilicon layer through a lateral outgrowth.

Referring to FIG. 11, the remaining layer 60 is removed though a selective RIE etch process. Monosilicon layer 35 is grown through a lateral outgrowth, preferably by an in-situ doped process. The layer is highly doped to reduce parasitic resistance. The dopant concentration varies between from 1e19 to 1e21 $cm^{-3}$, preferably from 1e20 to 5e20 $cm^{-3}$. The layer is then subjected to CMP and possibly planarization.

Figure 12:
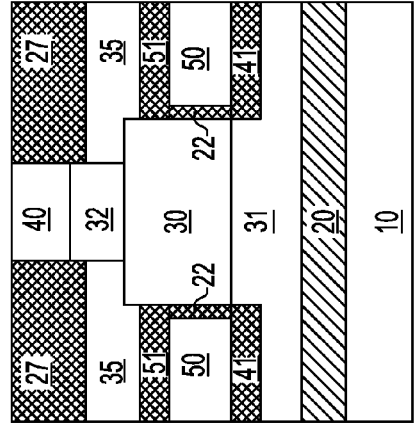
FIG. 12 shows a TEOS layer deployed and planarized.

Referring to FIG. 12, dielectric layer 27, preferably TEOS, is deposited and planarized by way of CMP and chemically cleaned. The dielectric layer can have a different etch rate compared to layers 40 and 32 to allow selective etching. Layer 40 is exposed in order to be removed in the next step.

Figure 13:
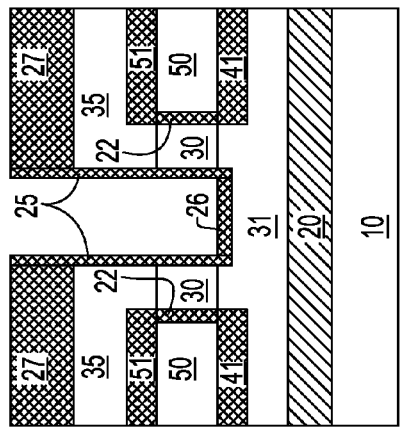
FIG. 13 shows all the layers forming the mesa removed.

Referring to FIG. 13, layer 40 is removed using a standard selective etching process, and is followed by removal of layer 32.

Figure 14:
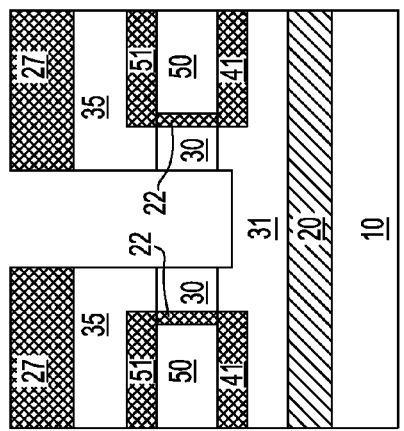
FIG. 14 depicts a trench dug through several layers to form a hallow tube.

Referring to FIG. 14, a trench is dug through layer 30 and partially through layer 31. At this stage, a unique semiconductor topology is formed in the shape of a hallow cylinder or tube. The outer side of the tube is surrounded with outer gate oxide (layer 22) and outer gate materials (layer 50)

Figure 15:
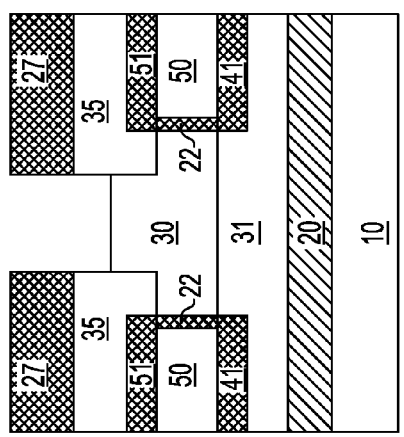
FIG. 15 illustrates a gate dielectric layer deposited on the vertical wall of the trench, with a dielectric layer formed on the horizontal bottom surface of the trench.

Referring to FIG. 15, a gate dielectric layer 25 is deposited on the vertical wall of layer 30 within the trench. A dielectric layer 26 is formed on the horizontal (bottom) surface of layer 31 inside the trench. Both layers 25 and 26 can be made of the same dielectric material. The thickness of layer 25 ranges from about 1 nm to 10 nm, preferably from 1.5 nm to 3 nm, whereas the thickness of layer 26 ranges between 1 nm to 30 nm, and preferably 10 nm to 20 nm. Layers 25 and 26 can be deployed simultaneously using thermal oxidation and/or thermal nitridation processes. In addition, the trench width 25 can be increased using one of the anisotropic deposition techniques known in the art such as, CVD, high-density, plasma-assisted deposition (HPD), atomic layer deposition (ALD), liquid source misted chemical deposition (LSMCD), and the like.

Figure 16:
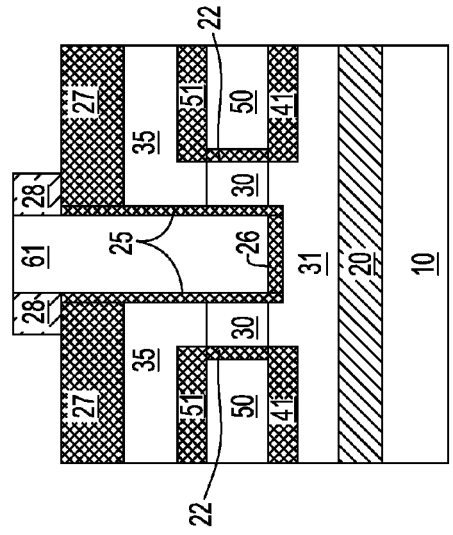
FIG. 16 illustrates the inner gate formed by filling up the trench with a conductive material followed by polishing.

Referring to FIG. 16, the inner gate 61 is formed by filling the trench with conductive material such as polysilicon or other metals. If needed, a gate cap layer can be deployed before filling up the trench. The structure is advantageously polished by CMP, followed by oxide layer 25 partially etched back to form the desired topology. At this stage, the intended hollow cylindrical semiconductor is formed with the wall sandwiched by inner and outer gate stacks. This unique topology has a tubular shape. The MOSFET thus formed, i.e., having the stated shape is referred to as Semiconductor Nanotube MOSFET. In the special case where the semiconductor is silicon, it is referenced as a Si Nanotube MOSFET.

Figure 17:
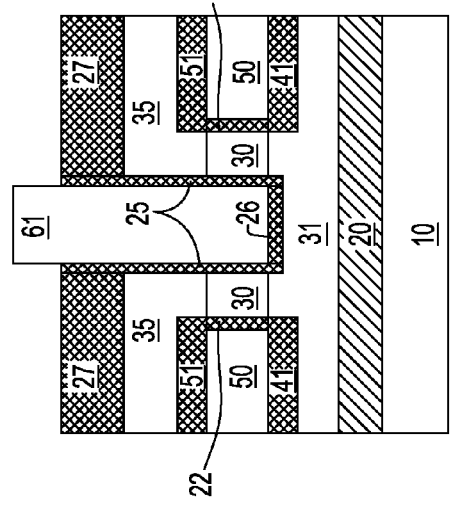
FIG. 17 shows a dielectric layer deployed in preparation for contact formation, etching a sidewall spacer surrounding the inner gate.

In FIG. 17, a dielectric layer 28 is deployed in preparation for contact formation. After etching isotropically the sidewall spacer surrounding the inner gate 61. Referring to FIGS. 18 and 19, contacts are depicted, formed in accordance with standard self-alignment process.

Figure 20:
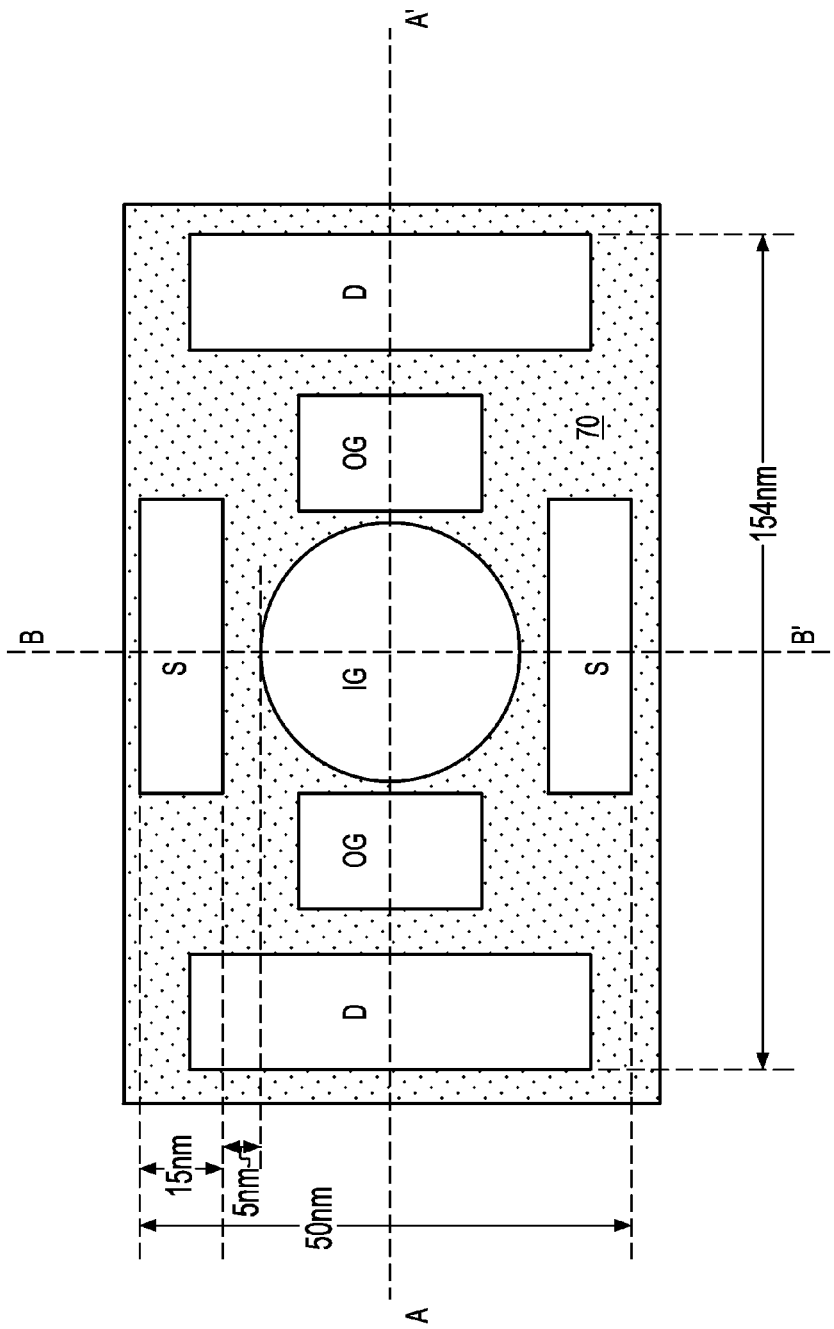
FIG. 20 shows a top-down view depicting one embodiment of the final structure of the invention, showing the source, drain, inner gate and outer gate, and the space there between filled with dielectric.

FIG. 20 is a top-down view illustrating the final structure of an embodiment of the invention, showing source 35, drain 31, inner gate 61 and outer gate 50, and the space 70 filled with dielectric.

Figure 21:
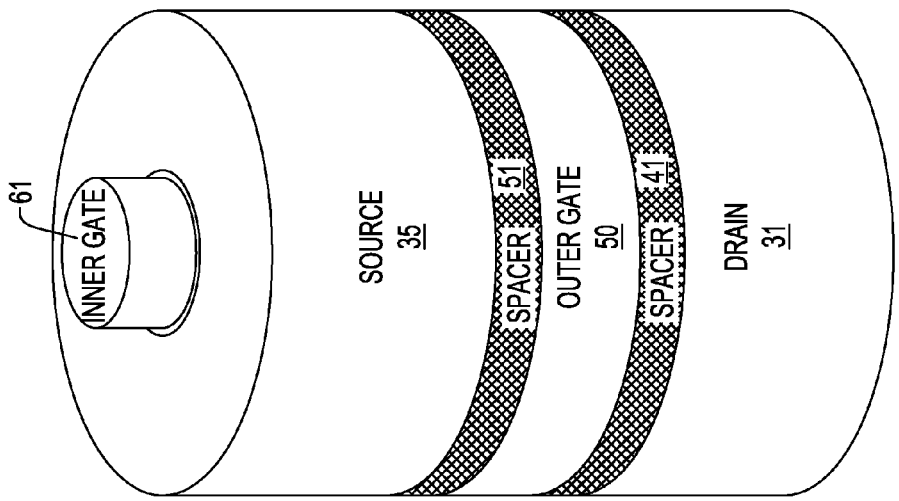
FIG. 21 is a 3D perspective view of the completed nanotube MOSFET, illustrating the inner and outer gates, the latter shown respectively separated from the drain and the source of the FET by spacers.

FIG. 21 is a 3D perspective view of a portion of the completed nanotube MOSFET, particularly showing the layers positioned between 30 and 35, i.e., 41, 50 and 51. FIG. 21 shown perspective view based on FIG. 18, wherein the contacts are omitted for clarity.

Figure 22:
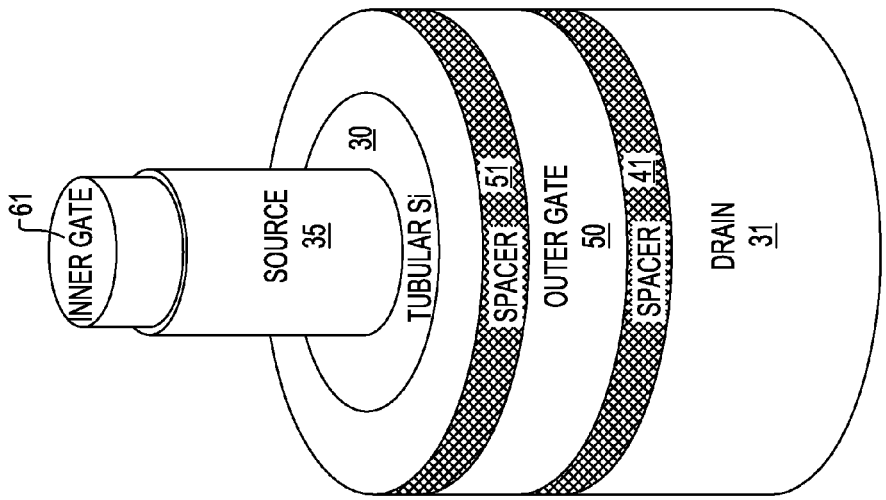
FIG. 22 shows a further 3D perspective view of the nanotube MOSFET where the inner gate is surrounded by a tubular inner gate oxide, which in turn is surrounded by a tubular Si layer.

FIG. 22 is based on FIG. 21 showing another 3D perspective view of the nanotube MOSFET device, wherein layer 35 is omitted in order to display the inner gate dielectric and adjoining layers thereof.

While the present invention has been particularly described in conjunction of a simple illustrative embodiment, it is to be understood that one of ordinary skill in the art can extend and apply this invention in many obvious ways. Other embodiments of the invention can be adapted thereto. It is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A nanotubular MOSFET device on a substrate comprising:
a cylindrical tubular inner gate and a cylindrical tubular outer gates separated from each other by a cylindrical shaped silicon layer, said outer gate surrounds said cylindrical silicon layer and positioned between a bottom spacer and a top spacer, a silicon epitaxial layer on top of, and in direct contact with, said top spacer adjacent to, and having epitaxy with respect to, a portion of said cylindrical shaped silicon layer, and an inner spacer at a bottom of said tubular inner gate, said inner spacer covering the entire bottom of said tubular inner gate.

2. The nanotubular MOSFET device recited in claim 1 further comprising a source and a drain respectively separated by spacers surrounding said tubular inner gate wherein said drain extends underneath both the cylindrical tubular inner gate and the cylindrical tubular outer gate.

3. The nanotubular MOSFET device recited in claim 2, further comprising a silicon substrate integral to said inner and outer gates, said source and said drain.

4. The nanotubular MOSFET device recited in claim 1, wherein said substrate is an SOI substrate.

5. The nanotubular MOSFET device recited in claim 1, wherein said substrate is made of bulk silicon.

6. The nanotubular MOSFET device recited in claim 1 wherein said Silicon layer has a tubular shape.

7. The nanotubular MOSFET device recited in claim 4, wherein said SOI substrate comprises a layer having a thickness ranging from 100 nm to 500 nm.

8. The nanotubular MOSFET device recited in claim 1, wherein said outer gate has a hollow cylindrical or tubular shape and is surrounded by an oxide layer.

9. The nanotubular MOSFET device recited in claim 8, wherein said outer gate dielectric is made of oxide, oxynitride, or hafnium oxide.

10. The nanotubular MOSFET device recited in claim 8, wherein said inner gate is made of dielectric and gate material.

11. The nanotubular MOSFET device recited in claim 2, wherein said source and said drain are made of self-aligned epitaxial silicon.

12. The nanotubular MOSFET device recited in claim 1, wherein said silicon layer separating said inner and outer gates has a tubular shape.

13. The nanotubular MOSFET device recited in claim 1 wherein said hollow cylinder partially fills said inner gate.

14. The nanotubular MOSFET device recited in claim 1 wherein said inner and outer gates have a concentric tubular configuration.

15. The nanotubular MOSFET device recited in claim 11, wherein a portion of said cylindrical shaped silicon layer is made of highly doped material.

16. The nanotubular MOSFET device recited in claim 13, further comprising a source on an extension region.

17. The nanotubular MOSFET device recited in claim 1, wherein said outer gate is a stack made of gate dielectric or polysilicon or metal.

18. The nanotubular MOSFET device recited in claim 17 wherein said outer gate stack is made of a gate dielectric material comprising $SiO_2$, or $HfO_2$ or a Hi-K dielectric.

19. The nanotubular MOSFET device recited in claim 11, wherein a sidewall spacer adjacent to said inner gate is silicided.

20. The nanotubular MOSFET device recited in claim 2 wherein said source is silicided.

21. The nanotubular MOSFET device recited in claim 1 further comprising contacts made of deep trenches accessing said outer gate.

22. The nanotubular MOSFET device recited in claim 1, wherein said inner gate is surrounded by oxide which is surrounded by said tubular silicon layer.

* * * * *